United States Patent [19]  
Jarrett

[11] Patent Number: 4,970,412  
[45] Date of Patent: Nov. 13, 1990

[54] COMPARATOR CIRCUIT  
[75] Inventor: Robert B. Jarrett, Tempe, Ariz.  
[73] Assignee: Motorola, Inc., Schaumburg, Ill.  
[21] Appl. No.: 386,063  
[22] Filed: Jul. 28, 1989  
[51] Int. Cl.$^5$ ........................................... H03K 5/153  
[52] U.S. Cl. ................................... 307/363; 307/359; 307/318  
[58] Field of Search ............... 307/350, 358, 359, 363, 307/318

[56] References Cited  
U.S. PATENT DOCUMENTS

| | | | |
|---|---|---|---|
| 4,258,277 | 3/1981 | Nutz | 307/363 |
| 4,525,638 | 6/1985 | Gray | 307/359 |
| 4,701,639 | 10/1987 | Stanojevic | 307/363 |
| 4,710,793 | 12/1987 | Gray | 307/359 |

Primary Examiner—John Zazworsky  
Attorney, Agent, or Firm—Michael D. Bingham

[57] ABSTRACT

A comparator circuit with hysteresis does not require any bias current as long as the input signal applied thereto is less than a lower threshold value of the comparator. The comparator includes a current source for providing a plurality of currents when enabled, a Zener diode coupled to the current source for initially enabling the former as the input signal exceeds an upper threshold value, an output circuit which when rendered operative is placed in parallel to the Zener and disables the same while maintaining the current source enabled and providing an output signal from the comparator, and an amplifier responsive to the current source which renders the output circuit operative as the magnitude of current sourced thereto exceeds a predetermined value. A feature of the comparator circuit is that the currents flowing in the output circuit and amplifier have complementary temperature coefficients whereby the composite temperature coefficient of the upper and lower threshold values of the comparator can be adjusted to have a substantially zero temperature coefficient.

9 Claims, 2 Drawing Sheets

COMPARATOR CIRCUIT

BACKGROUND OF THE INVENTION

The present invention relates to electronic switches and, more particularly, to a comparator circuit having hysteresis and controlled switching levels.

Comparator circuits are well known in the art. For example, a typical comparator circuit is comprised of a differetial amplifier the output of which changes states as an input signal applied to one input of the differential amplifier varies above and below a fixed bias potential applied to other input of the differential amplifier. Hysteresis may be provided by typically providing feedback from the output of the differntial amplifier to reduce the bias potential to a second level once the output changes states in response to the input signal exceeding the first bias potential. Hence, the input signal must decrease to a lower value ot switch the output state of the differential amplifier back to its orginal operating state.

A problem with all know prior art comparators is that they require a quiescent or bias current at all times. Thus, there is a need for an improved comparator circuit with hysteresis which requires zero input bias current until such time as an applied input signal exceeds an upper thereshold value wherein the comparator switches outputs states. As the input signal decreases below a lower threshold level, the comparator again requires no input bias current. In addition, it is desirable that the upper and lower switching threshold points have a predetermined or zero temperature coefficient.

SUMMARY OF THE INVENTION

Accordingly, it is an object of the present invention to provide an improved switching circuit.

It is another object of the present invention to provide an improved comparator having hysteresis.

Still another object of the present invention is to provide an improved comparator having hysteresis which requires zero bias current whenever the input signal is low.

A still further object of the present invention is to provide an improved comparator having hysteresis, and, which requires zero bias current whenever the input signal is low while the switching points of the comparator have a substantially zero temperature coefficient.

In accordance with the above and other objects, there is provided a comparator including a current source which when enabled supplies a plurality of currents and an enabling circuit responsive to an applied input signal exceeding an upper threshold value for enabling the current source, wherein switching circuit produces a thermal current for placing an output circuit in parallel with the enabling circuit as the magnitude of the themal current reaches a predetermined value whereby an output signal is provided from the comparator until such time as the applied input signal reaches a lower threshold value and the output signal is thereafter inhibited.

It is a feature of the invention that the output circuit provides a current having an opposite temperature coefficient as the thermal current whereby the upper and lower switching points of the comparator may have an overall zero temperature coefficient or any desired temperature coefficient.

DETAILED DESCRIPTION OF THE PREFERRED EMBODIMENT

Figure 1:
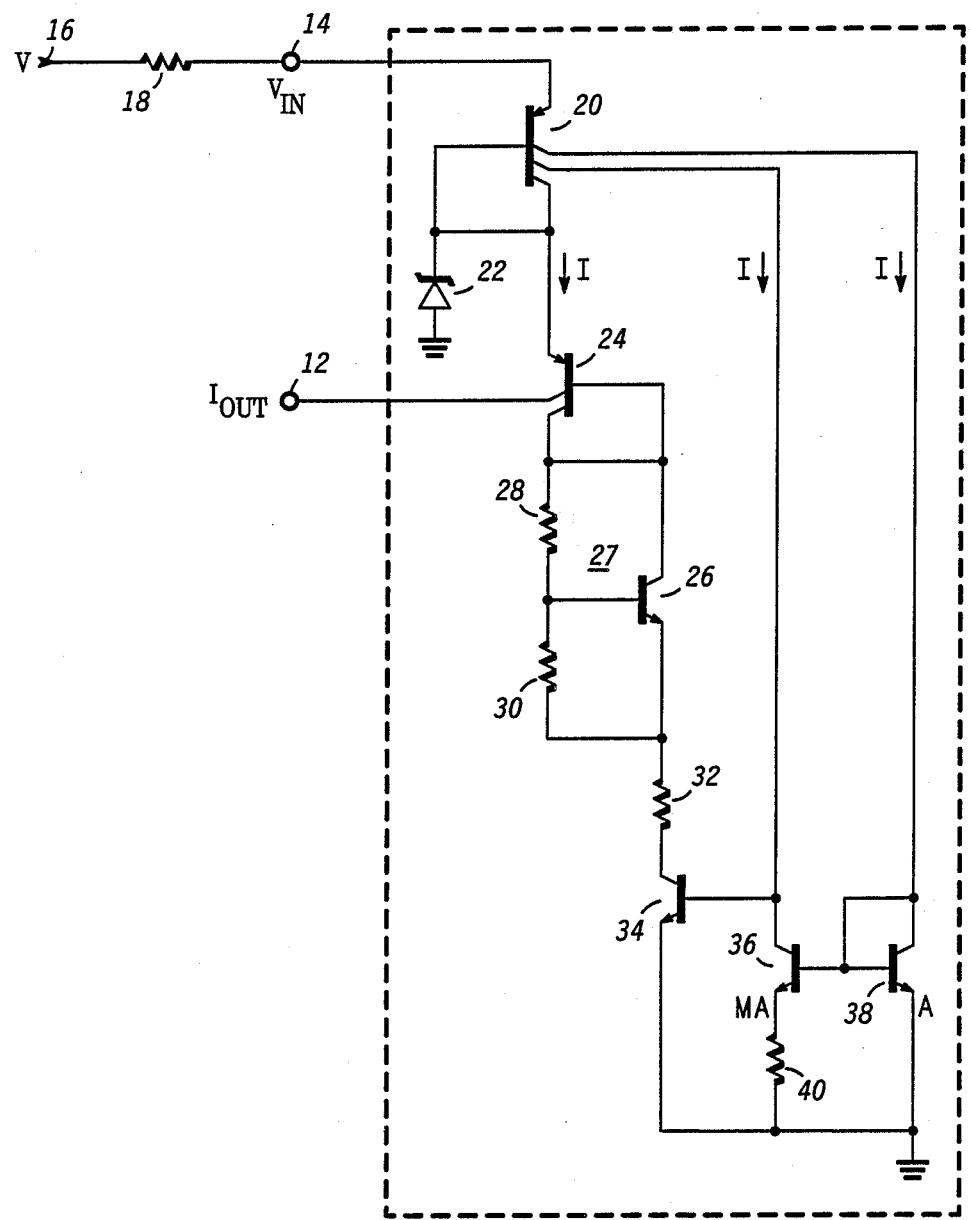
FIG. 1 is a schematic diagram illustrating one embodiment of the present invention.

Turning to FIG. 1, there is shown controlled current switch or comparator 10 suited to be manufactured in monolithic integrated circuit form which provides an output current, Iout, at output 12 in response to an applied input signal, Vin, being supplied to input terminal 14. A unique feature of the present invention is that comparator 10 does not require any bias or quiescent current until such time that Vin exceeds a predetermined upper threshold voltage value or after Vin falls below a lower threshold value or voltage as will be explained in detail hereinafter. Input terminal 14 is externally coupled to a source of voltage, V, at terminal 16 through resistor 18. Multi collector transistor 20, which has its emitter coupled to input terminal 14, and Zener diode 22, the latter of which is coupled between a first collector and a base of the transistor and ground voltage supply set the upper threshold voltage value of comparator 10. Output circuitry including multi collector transistor 24, N$\phi$ circuit 27 and resistor 32 provide the output current Iout and establishes the lower threshold value of comparator 10 when it is placed in parallel with Zener diode 22 by switching transistor 34 being turned on. As switching transistor 31 becomes saturated, the output circuitry is essentially connected between the cathode of Zener diode 22 and ground potential, hence, in electrically parallel thereto. Transistor 24 has its emitter connected to the common connection of the cathode of Zener diode 22 and a first collector and base of transistor 20, while a first one of its collectors is returned to its base and its other collector is coupled to output terminal 12. N$\phi$ circuit 27 comprises transistor 26, resistors 28 and 30 and is a well known structure for providing a voltage across the collector-emitter of the transistor the magnitude of which can be set to any multiple of the value $\phi$, where $\phi$ is the typical base-to-emitter voltage drop of the transistor having a negative temperature coefficient. Resistor 32 is coupled between N$\phi$ circuit 27 and the collector of switching transistor 34. Transistor 20 has additional two collectors that are coupled respectively to the collectors of transistors 36 and 38. Transistor 38 is connected as a diode having its base coupled both to its collector and the base of transistor 36. The emitters of transistors 36 and 38 are returned respectively via resistor 40 and directly to the ground voltage supply terminal, while the collector of transistor 36 is also connected to the base of switching transistor 34. As illustrated, transistor 36 has an emitter area equal to M times the emitter area of transistor 38. As understood, the emitter area of transistor 36 may be physically larger than the emitter area of transistor 36 by the factor M, or may have M multiple emitters.

In operation, comparator circuit 10 draws no bias current, i.e., emitter current through transistor 20 as long as the voltage Vin is initially less than the upper threshold value established by Zener 22 and the base-emitter voltage of transistor 20. Hence, Iout is zero and the output of comparator 10 is in a low output state. As Vin increases, or exceeds the value of:

$$V_Z+\phi \tag{1}$$

where $V_Z$ is the Zener breakdown voltage of diode 22, and $\phi=V_{BE}$ of transistor 20;

which is the upper threshold value or upper switch point, transistor 20 is enabled as diode 22 zeners and begins to turn on to source base and collector currents from transistor 20. The value of Vin is thus fixed at the value according to equation one. Assuming that the collectors of transistor 20 are matched and have equal area ratios, equal currents I are sourced to transistors 36 and 38. Additionally, since the emitter area of transistor 36 is greater than the emitter area of transistor 38, the former will be in a saturated state. In this condition, switching transistor 34 is inhibited from conducting and transistor 24 and 26 are turned off. As transistor 36 beings to conduct, a voltage, $\Delta\phi$, is developed across resistor 40 that is a thermal current having a positive temperature coefficient as is understood. When the sum of the base to emitter voltage of transistor 36 and $\Delta\phi$ equals the base to emitter voltage of transitor 38, transistor 36 is no longer saturated and excess current is available to the base of switching transistor 34 which allows this transistor to be rendered conducting. The value of the current I at this point is equal to $\Delta\phi/R$ where R is the resistance value of resistor 40 and $\Delta\phi$ is equal to the value, $(kT/q) \ln M$. Hence, the upper switch point or threshold value is reached at this predetermined maximum current value. Transistor 34 then saturates to essentially place its collector at ground reference potential. Transistor 24, $N\phi$ circuit 27 and resistor 32 are then connected in parallel to Zener diode 22 and transistor 24 is thereby turned on to source the current Iout as comparator 10 switches output states and the output circuitry is rendered operative. Hysteresis is introduced into comparator 10 by ensuring that the sum of the voltage drops across resistor 32, $N\phi$ circuit 27 and the base-emitter of transistor 24 are less than $V_Z$. For further increases in V, Vin remains clamped at the value Vin and the emitter current of transistor 20 increases proportionally. Iout remains enabled. Then, as V and Vin decrease below the upper threshold value, transistor 20 remains conductive as transistor 24 provides base current drive thereto even though Zener diode 22 is no longer in its conducting state. Iout is provided until the value of Vin falls below the lower threshold value or switching point which is equal to $$\phi_{20}+\phi_{24}+N\phi+IR_{32} \tag{2}$$

where $\phi_{24}$ is the base emitter voltage of transistor 24, $N\phi$ is voltage drop across the collector-emitter of transistor 26, and
$IR_{32}$ is the voltage drop across resistor 32.

It can be shown that at lower trip point, the current flowing through transistor 24 is is equal to the value $\Delta\phi_{32}/R$. Moreover, since the base-emitter voltages of transistors 20, 24 and 26 have a negative temperature coefficient, the positive temperature coefficient of the thermal current $\Delta\phi/R$ may be compensated for wherein the upper and lower threshold voltages can be made to have a zero temperature coefficient or any other desired temperature coefficient.

Figure 2:
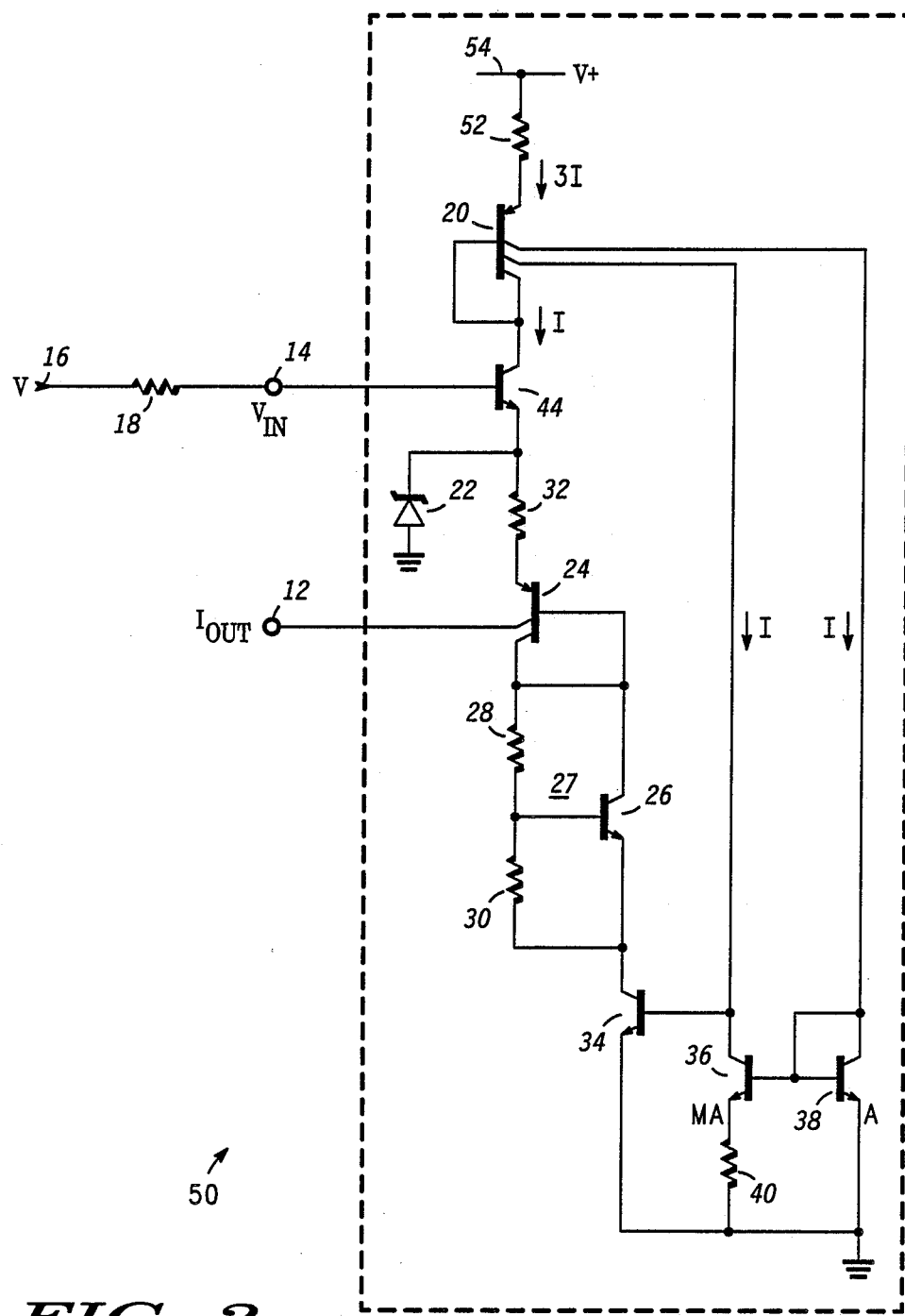
FIG. 2 is a schematic diagram illustrating another embodiment of the present invention.

Referring now to FIG. 2, there is illustrated comparator 50 which operates in substantially the same manner as described above. Components of comparator 50 corresponding to like components of FIG. 1 are designated by the same reference numerals. Resistor 32 of comparator 50 has been moved with respect to comparator 10 and is coupled between the cathode of Zener diode 22 and the emitter of transistor 24 while the collector-emitter conduction path of transistor 44 is coupled between the first collector of transistor 20 and the cathode of diode 22. Input terminal 14 is coupled to the base of transistor 44 and the emitter of the transistor 20 is coupled via the resistor 52 to positive supply terminal 54.

The upper switch point or threshold value of comparator 50 is now equal to:

$$V_Z+\phi_{44} \tag{3}$$

where $\phi_{44}$ is the base-emitter voltage of transistor 44. Again, comparator 52 only draws bias current after changing opposite state as the voltage Vin exceeds the upper threshold value and until the lower threshold value has been reached. At all other times, zero bias current is required by the comparator.

Hence, what has been described is a novel comparator having hysteresis which draws zero bias current as long as the voltage supplied at the input is below the upper threshold or switching point of the comparator. Moreover, the temperature coefficient of the upper and lower threshold voltages is adjustable and may be set to be substantially zero.

What is claimed is:

1. A comparator circuit having an input and output, comprising:
   current source means for supplying a plurality of currents when enabled;
   enable means coupled to said current source means and being responsive to an input signal applied to the input of the circuit exceeding an upper threshold value for enabling said current source means;
   output circuitry coupled both to said current source means and said enable means for providing an output signal at the output of the circuit when said output circuit is rendered operative until said output circuitry is disabled as said input signal decreases below a lower threshold value, said output circuit circuitry being placed electrically in parallel to said enable means when rendered operative, and
   switching circuitry responsive to said current source means for rendering said output circuit circuitry operative as the magnitude of at least one current supplied from said current source reaches a predetermined value.

2. The comparator circuit of claim 1 wherein said amplifier means includes:
   a switching transistor having a base, an emitter coupled to a voltage supply terminal and a collector coupled to said output circuit means; and
   first curcuit means responsive to said current source means and coupled to the base of said switching transistor rendering the latter operative as said at least one current exceeds said predetermined value, said at least one current having a predetermined temperature coefficient.

3. The comparator circuit of claim 2 wherein said output circuit means includes:
   a first transistor having an emitter coupled to said enable means, a first collector coupled to the output and a second collector coupled to its base;
   second circuit means coupled between said base of said first transistor and said collector of said switching transistor for providing a predetermined voltage there cross, said first transistor and second circuit means having a predetermined temperature coefficient that is opposite of said temperature coefficient of said at least one current wherein said upper and lower threshold values have a predetermined temperature coefficient.

4. The comparator circuit of claim 3 wherein said first circuit means includes:
 a second transistor having a base, collector and emitter, said base being coupled with said collector to said current source means and said emitter being coupled to said voltage supply terminal;
 a third transistor having base coupled to said base of said second transistor, a collector coupled both to said current source means and said base of said switching transistor, and an emitter; and
 a first resistor coupled between said emitter of said third transistor and said voltage supply terminal.

5. The comparator circuit of claim 4 wherein said second circuit means includes:
 an N$\phi$ circuit; and
 a second resistor said second resistor being coupled in series with said N$\phi$ circuit between said second collector of said first transistor and said collector of said switching transistor.

6. The comparator circuit of claim 5 wherein said current source means includes a fourth transistor having an emitter coupled to the input, a first collector coupled to said enable means and said emitter of said first transistor, a second collector coupled to said collector of said second transistor, a third collector coupled to said collector of said third transistor and a base coupled to said first collector.

7. The comparator circuit of claim 6 wherein said enable means includes a Zener diode coupled between said base of said fourth transistor and said voltage supply terminal.

8. The comparator circuit of claim 5 wherein said current source means includes a fourth transistor having an emitter coupled to a positive voltage supply terminal, a base, a first collector coupled to said base, second and third collectors coupled respectively to said collectors of said second and third transistors.

9. The comparator circuit of claim 8 wherein said enable means includes:
 a fifth transistor having a collector coupled to said first collector of said fourth transistor, a base coupled to the input and an emitter; and
 a Zener diode coupled between said emitter of said fifth transistor and said voltage supply terminal.

* * * * *